United States Patent
Decloedt

(10) Patent No.: US 7,216,314 B2
(45) Date of Patent: May 8, 2007

(54) INTEGRATED CIRCUIT VERIFICATION METHOD

(75) Inventor: Loic Decloedt, Grenoble (FR)

(73) Assignee: Dolfin Integration, Meylan (FR)

( * ) Notice: Subject to any disclaimer, the term of this patent is extended or adjusted under 35 U.S.C. 154(b) by 33 days.

(21) Appl. No.: 10/987,860

(22) Filed: Nov. 12, 2004

(65) Prior Publication Data

US 2005/0144578 A1 Jun. 30, 2005

(30) Foreign Application Priority Data

Nov. 13, 2003 (FR) .................................. 03 50833

(51) Int. Cl.
  *G06F 17/50* (2006.01)
(52) U.S. Cl. .................... 716/5; 716/4; 716/11; 716/19
(58) Field of Classification Search ................ 716/3–5, 716/11, 19
  See application file for complete search history.

(56) References Cited

U.S. PATENT DOCUMENTS

| | | | |
|---|---|---|---|
| 5,787,006 A * | 7/1998 | Chevallier et al. ............. | 716/5 |
| 6,077,308 A * | 6/2000 | Carter et al. .................... | 716/8 |
| 6,230,299 B1 | 5/2001 | McSherry et al. | |
| 6,289,412 B1 | 9/2001 | Yuan et al. | |
| 6,363,516 B1 | 3/2002 | Cano et al. | |
| 6,438,729 B1 | 8/2002 | Ho | |
| 6,480,995 B1 * | 11/2002 | Schmidt et al. ............... | 716/11 |
| 2002/0138813 A1 * | 9/2002 | Teh et al. ...................... | 716/5 |
| 2002/0166108 A1 * | 11/2002 | Rittman ....................... | 716/19 |
| 2004/0194040 A1 * | 9/2004 | Joshi et al. .................... | 716/4 |

OTHER PUBLICATIONS

European Search Report dated Aug. 8, 2005 for related European Patent Application No. EP 04105742.

* cited by examiner

*Primary Examiner*—Paul Dinh
(74) *Attorney, Agent, or Firm*—Plevy, Howard & Darcy PC

(57) ABSTRACT

A method for verifying an integrated circuit comprising components connected by connections, the integrated circuit being defined by "physical" and "schematic" representations, comprising the steps of: establishing an annotated physical description of the circuit which enables associating with each connection of the schematic representation several polygons of the physical representation forming a track; defining at least one type of electric signal capable of propagating on the connections; defining, for each signal type, rules to be verified by each track on which the considered type of signal can propagate, specific geometric features of a given track and/or features relative to the positioning of a given track with respect to other tracks having to be verified for each rule; determining, for each connection, whether the tracks associated with the studied connections verify the rules corresponding to the signal types capable of propagating on each connection.

3 Claims, 4 Drawing Sheets

INTEGRATED CIRCUIT VERIFICATION METHOD

CLAIM FOR PRIORITY

This application claims the benefit of French Application No. 03/50833, filed Nov. 13, 2003 and is incorporated herein by reference.

BACKGROUND OF THE INVENTION

1. Field of the Invention

The present invention relates to methods for verifying an integrated circuit prior to its manufacturing.

2. Discussion of the Related Art

The manufacturing of an integrated circuit is performed based on a set of masks. Each mask generally comprises a set of polygons which enable defining semiconductor areas, insulating areas, transistor gates, conductive tracks, and other elements of the integrated circuit. The set of masks corresponding to an integrated circuit is formed from a "physical" representation of the circuit on which are defined a set of polygons of various types from which it is possible to manufacture all the masks.

The polygons defined on a physical representation of an integrated circuit correspond to an assembly of interconnected components connected to input/output pads by electric connections. The components and the connections are generally explicitly defined in a "schematic" representation of the integrated circuit. Each component and each connection of the schematic representation corresponds to a set of polygons defined on the physical representation. Each set of polygons associated with a connection will be called a track hereafter.

FIG. 1 is an example of a schematic representation of an integrated circuit, and more specifically of a SRAM point corresponding to a basic element of a SRAM. The SRAM point comprises two looped inverters I1 and I2, the output of one inverter being connected to the input of the other one. The SRAM point further comprises two NMOS access transistors Ta1 and Ta2 controlled by a word line WL. Transistor Ta1 is placed between the output of inverter I1 and a bit line BL. Transistor Ta2 is placed between the output of inverter I2 and a bit line BLN.

FIG. 2 is a schematic representation of an inverter such as inverters I1 and I2. An inverter comprises a PMOS transistor P1 and an NMOS transistor N1 in series between a power supply Vdd and a ground GND. The gates of transistors P1 and N1 are connected to an input pad A. The drains of transistors P1 and N1 are connected to an output pad Z.

FIG. 3 is an example of a physical representation of a SRAM point corresponding to the above-described electric representation. This physical representation substantially corresponds to a top view of the integrated circuit masks such as it could be seen on a display screen and thus, what is at the top of the drawing is above what is at the bottom of the drawing. Similarly, what is described as being horizontal or vertical refers to an on-screen representation. Such considerations will be valid for all the physical representations described hereafter. Each transistor is represented by an active area and a gate area intersecting perpendicularly. Metal areas enable interconnecting active areas and/or gate areas.

Two rectangular active areas 1 and 2 are placed horizontally, area 1 being at the top and area 2 at the bottom of FIG. 3. Two rectangular active areas 3 and 4 are placed horizontally on each side of active area 2. Two gate areas 5 and 6 substantially having the shape of vertical tracks cut active areas 1 and 2 perpendicularly, areas 5 and 6 being respectively placed to the left and to the right. Two gate areas 7 and 8 substantially having the shape of short vertical tracks cut active areas 3 and 4. Active area 1 is P-type doped and active areas 2, 3, and 4 are N-type doped.

The portion of active area 1 located between gate areas 5 and 6 forms the source of the PMOS transistors of each of inverters I1 and I2. The portions of active area 1 located on either side of gate areas 5 and 6 form the drains of the PMOS transistors of inverters I1 and I2. Similarly, the portion of active area 2 located between gate areas 5 and 6 forms the source of the NMOS transistors of each of inverters I1 and I2. The portions of active area 2 located on either side of gate areas 5 and 6 form the drains of the NMOS transistors of inverters I1 and I2. The portions of active areas 3 and 4 located on either side of gate areas 7 and 8 form source/drain areas of access transistors Ta1 and Ta2.

Two rail-shaped horizontal metal areas 10 and 11 are respectively placed above and under active areas 1, 2, 3 and gate areas 5, 6, 7, and 8. Areas 10 and 11 are intended to be respectively connected to power supply Vdd and to ground GND. A metal area 12 connects track 10 (Vdd) to the portion of active area 1 forming the source of the PMOS transistors. A metal area 13 connects track 11 (GND) to the portion of active area 2 forming the source of the NMOS transistors. A metal area 14 connects the left-hand portions of active areas 1 and 2 corresponding to drain areas. Similarly, a metal area 15 connects the right-hand portions of active areas 1 and 2 corresponding to drain areas. Two metal areas 16 and 17 connect metal areas 14 and 15 respectively to gate areas 6 and 5. A metal area 18 connects the portions of active source/drain areas 2 and 3 located next to each other. Similarly, a metal area 19 connects the portions of active source/drain areas 2 and 4 located next to each other. The lateral portions of active areas 3 and 4 are respectively connected to two metal areas 20 and 21 corresponding to bit lines BL and BLN. Gate areas 7 and 8 are respectively connected to two metal areas 22 and 23 corresponding to word lines WL and WLN. Each connection between a metal area and an active area or a gate area is ensured by a conductive via represented by a cross placed in a square.

The existing methods for verifying an integrated circuit defined by a physical representation and a schematic representation such as described hereabove generally comprise the next three steps.

A first step consists of verifying the circuit functionality, this being generally performed by means of an electric simulation performed based on the schematic representation of the circuit. In an electric simulation, a series of states corresponding to a series of stimuli applied on the circuit inputs is defined based on an initial electric state of the circuit. For each state of the circuit, the electric voltage, or the logic level "0" or "1", of each of the circuit connections, is defined. If necessary, especially in the case of so-called "analog" circuits, the value of the input or output currents of each of the circuit components is also determined. The analysis of the series of circuit states obtained after simulation enables verifying the circuit functionality.

A second step consists of verifying that the circuit such as defined by the physical representation fulfils all manufacturing constraints. This second step gathers several verifications known as DRC, DFM, and ERC (Design Rule Check, Design For Manufacturing, and Electrical Rule Check) and mainly consists of verifying the geometric features of each polygon (width, surface area, . . . ) and the intervals between the various polygons of the physical representation of the circuit.

A third step, known as the LVS step (Layout Versus Schematic), consists of verifying that all the polygons of the physical representation actually correspond to the components and connections of the schematic representation. For this purpose, a first list of components and of connections is "extracted" from the physical representation by performing a recognition of polygon groups, each corresponding either to a known component type, or to a connection. As an example, the association of a perpendicularly-intersecting active area and of gate area is recognized as defining a transistor. In parallel, a second list of components and of connections is established based on the schematic representation. It is then verified that the two lists do comprise the same components and identical connections between the various components.

Such existing integrated circuit verification methods do not enable detecting certain weaknesses of a circuit manufactured according to the most recent methods. The possibly weaknesses of a "modern" circuit are of various natures and each type of weakness generates a malfunction of the circuit in specific circuit use conditions. When the circuit is used in conditions likely to "reveal" certain weaknesses of the circuit, the most current phenomena that can occur at the circuit level are the following.

A known phenomenon is the electromigration of one or several metal areas which generally results in a cutting of the metal tracks. The potential track electromigration risks are all the greater as the size and the complexity of the circuits is greater. No circuit verification method enables detecting areas at risk. Only the designer's vigilance can avoid this type of problem.

Another known phenomenon is the modification of the voltage, in other words, a state switching, of a metal track due to a stray capacitive coupling between two metal tracks.

Another known phenomenon is the local supply voltage decrease, in portions of a circuit where many components simultaneously conduct strong electric currents, the voltage decrease being proportional to the total requested current and to the resistance of the supply tracks. This phenomenon is generally observed in so-called synchronous circuits for which the latch registers all switch at the same moment. A local decrease in the power supply results in a poor operation of the under-supplied cells.

Certain weak areas likely to cause the occurrence of the last two above-mentioned phenomena can be partially detected by performing an electric simulation of the circuit based on a "improved" schematic representation comprising parasitic components (resistors, capacitors, coils) determined from the physical representation of the circuit and especially from all the conductive areas corresponding to the various connections defined in the schematic representation. However, current methods for extracting all these parasitic components do not enable determining with a sufficient accuracy the resistive, capacitive, and inductive values of the parasitic components, and this, all the more as the circuit size is large and as the physical representation is organized in several hierarchical levels. Further, the size of the "improved" schematic representation obtained after extraction of the parasitic components is generally from two to three times as high as the schematic base representation and its electric simulation may be very long and require many computer resources. The simulation difficulty then results in limiting the number of tested stimuli, which strongly decreases the possibilities of detecting possible weaknesses.

Further, even if wide hardware and time resources are available, the definition of "exhaustive" stimuli enabling testing all the cases of use often appears to be impossible.

The above-mentioned problems appear when a metal track has a shape or a positioning with respect to the other tracks which is inappropriate to its use. A problem may occur on a track, for example, in the case where the current density running through it is too high or in the case where the frequency of the electric signal running through it or running through a close track is too high.

SUMMARY OF THE INVENTION

An object of the present invention is to provide a method for verifying an integrated circuit, which is capable of rapidly verifying that each metal track has geometric features and/or a positioning with respect to the other tracks adapted to its use.

To achieve this object, the present invention provides a method for verifying an integrated circuit comprising components connected by connections, the integrated circuit being defined by a "physical" representation and a "schematic" representation, the physical representation consisting of an assembly of polygons of various types used to form a set of masks used for the integrated circuit manufacturing, the schematic representation symbolically defining the circuit components and the connections between these components, the method comprising the steps of: establishing an annotated physical description of the circuit which enables associating with each connection of the schematic representation a set of polygons of the physical representation forming a track; defining at least one type of electric signal capable of propagating on the various circuit connections; defining, for each signal type, one or several rules to be verified by each of the tracks corresponding to the connections on which the considered type of signal is capable of propagating, specific geometric features of a given track and/or features relative to the positioning of a given track with respect to other tracks having to be verified for each rule; determining, for all or part of the connections, whether the tracks associated with the studied connections verify the rule(s) corresponding to the signal types capable of propagating on each of the connections.

The foregoing object, features, and advantages, as well as others of the present invention will be discussed in detail in the following non-limiting description of specific embodiments in connection with the accompanying drawings.

DETAILED DESCRIPTION

The method of the present invention enables, from a physical representation and a schematic representation of an integrated circuit, verifying the specific geometric features of a track and/or the positioning features of a track with respect to the positionings of other tracks according to the type of electric signal capable of propagating on the studied track. To perform such a verification, the method of the present invention comprises several steps defined hereafter.

1. Annotated Physical Description

A first step consists of establishing an annotated physical description of the circuit from which it is possible to associate with each connection of the schematic representation of the circuit a track formed of one or several polygons of the physical representation. The definition of an annotated physical description of a circuit is specified hereafter based on a very simple circuit example, an inverter, and then based on a more complicated "hierarchical" circuit example.

1.1. Annotated Physical Description of a Simple Circuit

Figure 2:
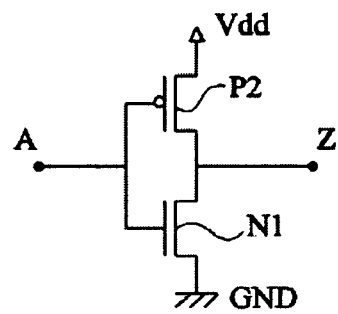
FIG. 2 is a schematic representation, previously described, of an inverter.
Figure 4:
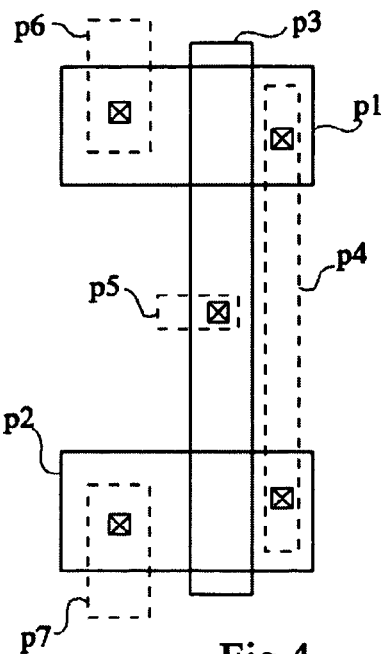
FIG. 4 is a physical representation of an inverter.

FIG. 4 is a physical representation of an inverter corresponding to the schematic representation of FIG. 2. Two rectangular active areas p1 and p2 are placed horizontally one above the other, area p1 being on top. A gate area p3 substantially having the shape of a vertical track cuts active areas p1 and p2 perpendicularly. The portions of active areas p1 and p2 uncovered by gate area p3 are respectively P- and N-type doped. A vertical metal area p4 connects the portions of active areas p1 and p2 located to the right of gate area p3. A short horizontal metal area p5 is substantially connected to the middle of gate area p3. Metal area p5 forms the input terminal of the inverter, metal area p4 forming the output terminal. Two short vertical metal areas p6 and p7 are respectively connected to the portions of active areas p1 and p2 located to the left of gate area p3. Metal areas p6 and p7 are intended to be respectively connected to power supply Vdd and to ground GND. The various metal areas are connected to the active or gate areas by a conductive via shown by a cross in a square. Further, the metal areas are in this physical representation all formed on the same integrated circuit metallization level and more specifically on the first metal level "métal1" placed immediately above the active components formed in the semiconductor substrate of the integrated circuit.

The physical representation of an integrated circuit is generally obtained by means of a computer device. The physical representations displayed on the screen of the computer device are substantially those shown in FIGS. 3 and 4. The polygons of the physical representation are described in one or several computer files. The file(s) describing each of the polygons form a physical description of the circuit.

In a conventional physical description of a circuit, each polygon is defined by a series of coordinates of the points defining the polygon and a "type" indicating whether the polygon is in an active area, a gate area, a metal area, or other. In the example of the inverter shown in FIG. 4, a conventional physical description is given in the following table I. The coordinates of the points defining the polygons are given, in this example, in a Cartesian referential.

p1: (0;8)(4;8)(4;10)(0;10)-active
p2: (0;1)(4;1)(4;3)(0;3)-active
p3: (2;0.5)(3;0.5)(3;10.5)(2;10.5)-gate
p4: (3.25;1.25)(3.75;1.25)(3.75;9.75)(3.25;9.75)-métal1
p5: (1.5;5.25)(2.75;5.25)(2.75;5.75)(1.5;5.75)-métal1
p6: (0.5;8.5)(1.5;8.5)(1.5;11)(0.5;11)-métal1
p7: (0.5;0)(1.5;0)(1.5;2.5)(0.5;2.5)-métal1

The first step of the method of the present invention aims at establishing an "annotated" physical description of the circuit which contains additional elements with respect to a current description such as defined hereabove. The additional elements aim at indicating whether a given polygon corresponds to one of the connections defined in the schematic circuit representation.

In the example of an inverter, the description given hereabove is annotated according to the following table II:

p1: (0;8)(4;8)(4;10)(0;10)-active
p2: (0;1)(4;1)(4;3)(0;3)-active
p3: (2;0.5)(3;0.5)(3;10.5)(2;10.5)-gate
p4: (3.25;1.25)(3.75;1.25)(3.75;9.75)(3.25;9.75)-métal1-Z
p5: (1.5;5.25)(2.75;5.25)(2.75;5.75)(1.5;5.75)-métal1-A
p6: (0.5;8.5)(1.5;8.5)(1.5;11)(0.5;11)-métal1-Vdd
p7: (0.5;0)(1.5;0)(1.5;2.5)(0.5;2.5)-métal1-GND Based on this annotated physical description, it is possible to associate with each connection of the schematic representation of the inverter a track of the physical representation. In the example hereabove, each track corresponds to a single polygon, or in other words to a single metal area. However, in more complex circuits, a track is generally formed of several polygons.

An annotated physical description of a circuit may be obtained according to various methods.

One method consists of defining from as soon as the creation of a polygon the connection to which it corresponds. This method is in practice possible to envisage only for very simple circuits such as the above-described inverter.

Another method consists of initially creating a physical representation and an associated conventional physical description which contains no connection information or which only contain some for part of the polygons. A first list of components and of connections between these components based on the physical representation of the circuit is then extracted. The components and the connections defined in this first list have arbitrary names. It is defined, in an association file, to which set of polygons each component and each connection of the first list corresponds, the polygon(s) corresponding to a connection forming a track. In parallel, a second list of components and connections is established from the schematic representation. The correspondences between the components and the connections of the two lists are then determined according to known methods especially used in verification methods known as LVS. By means of the association file, it is then determined to which connection of the schematic representation each track and, by extension, each of the track polygons corresponds.

This method enables performing an automatically-annotated description. As compared with the first mentioned method, it enables saving time upon design of the physical representation of the circuit. This second method may in particular be used when the circuit has a significant size.

1.2. Annotated Physical Description of a Hierarchical Circuit

An example of a hierarchical circuit is given hereafter. The physical representation of a hierarchic circuit is constructed from "basic" bricks. Each basic brick is a physical representation of an element generally used several times in the complete physical representation.

Figure 5:
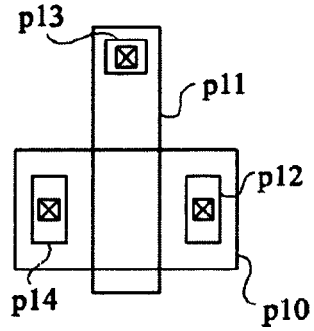
FIG. 5 is a physical representation of an NMOS transistor.
Figure 6:
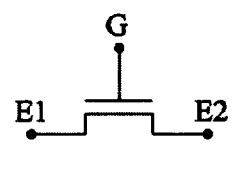
FIG. 6 is a schematic representation of a MOS transistor.

FIGS. 5 and 6 respectively are a physical representation of an NMOS transistor and a schematic representation of this transistor. The physical representation comprises a rectangular and horizontal active area p10, a rectangular and vertical gate area p1 perpendicularly cutting active area p10, as well as three metal areas p12, p13, and p14 respectively connected to the portion of active area p10 located to the right of gate area p1, to the portion of gate p1 and to the portion of active area p10 located to the left of gate area p1. Metal areas p12, p13, and p14 are all formed on the first available metal level "métal1". The schematic representation comprises a transistor T having its gate connected to a connection or terminal G, and the source/drain areas are connected to connections E1 and E2.

Figure 7:
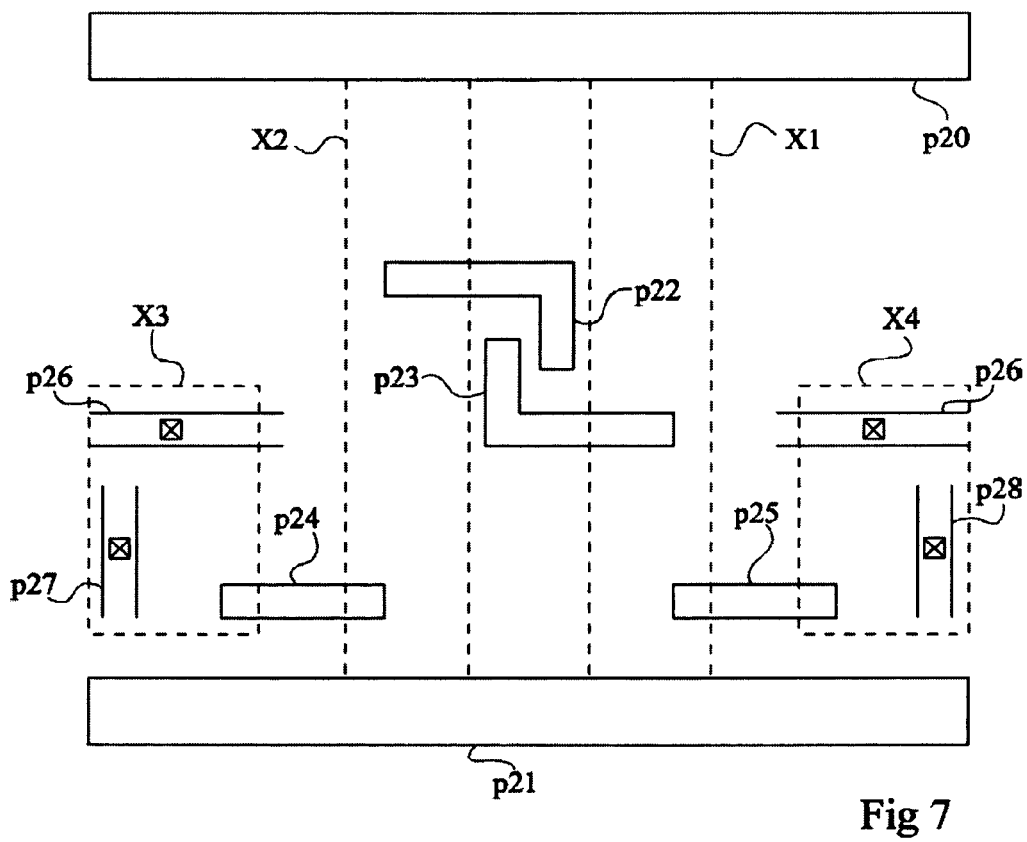
FIG. 7 is a hierarchical physical representation of a SRAM point.

FIG. 7 is a hierarchical physical representation of a SRAM point constructed based on two basic bricks: the inverter and the NMOS transistor respectively shown in FIGS. 4 and 5. The memory point comprises two replicas X1 and X2 of the inverter and two replicas X3 and X4 of the NMOS transistor. As known by those skilled in the art, from a computer point of view, each replica is generally a virtual copy of the physical representation of a basic brick. In practice, the physical representation of the inverter is described only once in the computer file and the physical representation of each replica is obtained by reading of the description of the "copied" object. Replicas X1, X3, and X4 are placed on the physical representation of the SRAM point with an orientation identical to the orientation of the corresponding basic brick. Replica X2 of the inverter is however placed on the physical representation of the SRAM point after having undergone a transformation corresponding to the creation of the symmetrical of the physical representation of the inverter with respect to a vertical straight line superposing with the left-hand vertical sides of active areas p1 and p2. Replicas X1 and X2 appear as being partially superposed so that tracks p6 (or p7) of each replica are perfectly superposed. The superposition of two tracks of the same type finally forms a single track. As for replicas X3 and X4, they are respectively placed to the left of replica X2 and to the right of replica X3.

Figure 3:
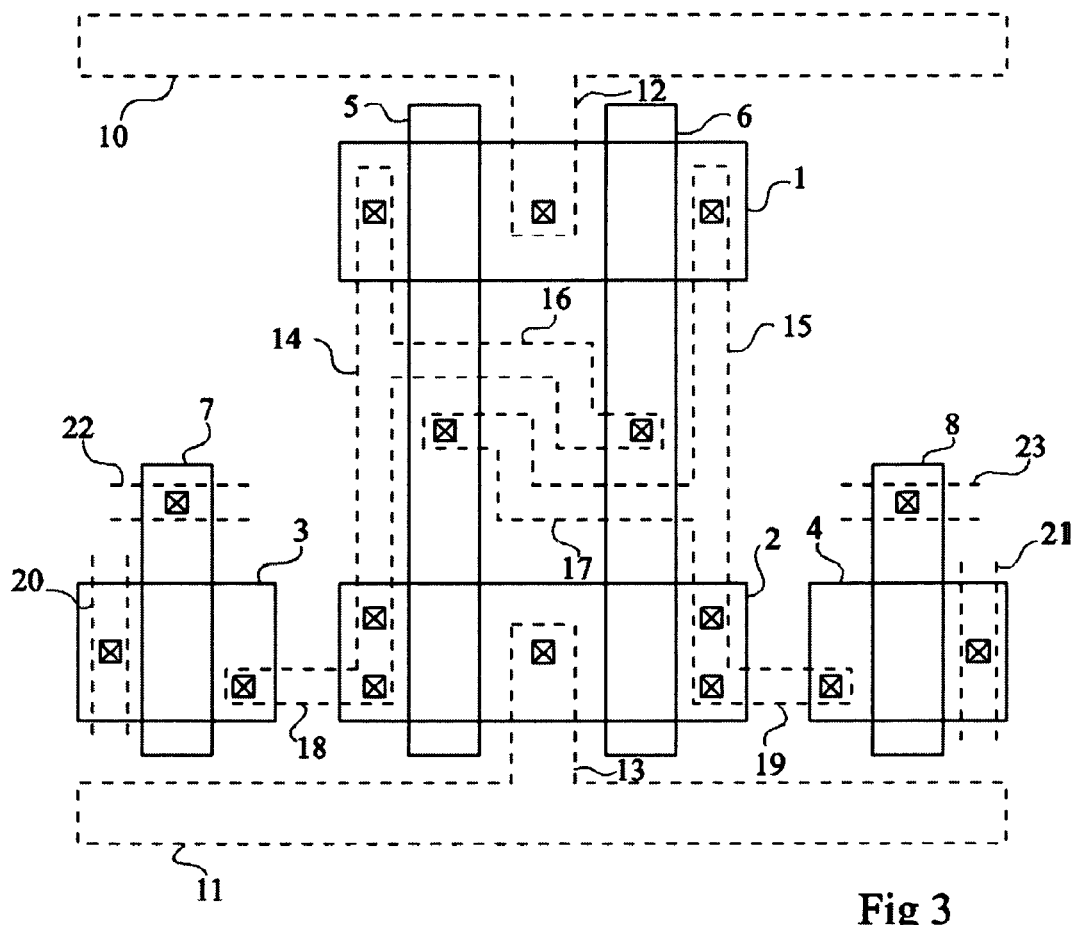
FIG. 3 is a physical representation, previously described, of the SRAM point of FIG. 1.

The memory point further comprises metal areas positioned so that a "flat laying" of the entire hierarchical physical representation of this memory point would provide the physical representation of FIG. 3. Two horizontal metal areas p20 and p21 are placed respectively above and under replicas X1 to X4, like areas 10 and 11 of the "flat laid" physical representation of FIG. 3. Two metal areas p22 and p23, having shapes respectively identical to areas 16 and 17, are placed to connect track p4 of an inverter to the area p5 of the other inverter. Two horizontal metal areas p24 and p25 are placed to respectively connect area p4 of inverter X2 to area p12 of transistor X3 and area p4 of inverter X1 to area p14 of transistor X4. Metal areas p22 to p25 are formed on a first metal level "métal1". A horizontal metal area p26, partially shown, is placed on a second metal level "métal2" above areas p13 of transistors X3 and X4 to which it is connected by two conductive vias represented by a cross in a square. Similarly, two vertical metal areas p27 and p28, partially shown, are placed on a third metal level "métal3" respectively above track p14 of transistor X3 and track p10 of transistor X4. Areas p27 and p28 are respectively connected to areas p14 of X3 and p10 of X4 by two superposed conductive vias represented by a cross in a square.

Generally, the physical description of a hierarchical circuit indexes in a file or in a file portion the different positioned replicas and all the areas and tracks added to the replicas. The physical description of the replicated elements is generally performed only once in separated files or in different parts of a same file possibly containing the physical description of the circuit in which the replicas are placed. The physical description of a replicated element indexes areas and possibly a replica of another element in the case where there are more than two hierarchical levels.

In the above-described SRAM point example, 3 files or file portions are used to describe the inverter, the transistor and the memory point, respectively shown in FIGS. 4, 5, and 7. The annotated physical description of the inverter is identical to that given hereabove in table I.

The annotated physical description of the transistor corresponding to the physical and schematic representations of FIGS. 5 and 6 is given in the following table III:

p10: (0;0.5)(3;0.5)(3;2.5)(0;2.5)-active
    p11: (1;0)(2;0)(2;4.5)(1;4.5)-gate
    p12: (2.25;1)(2.75;1)(3;2)(2.25;2)-métal1-E2
    p13: (1.25;3.5)(1.75;3.5)(1.75;4)(1.25;4)-métal1-G
    p14: (0.25;1)(0.75;1)(0.75;2)(0.25;2)-métal1-E1

Figure 1:
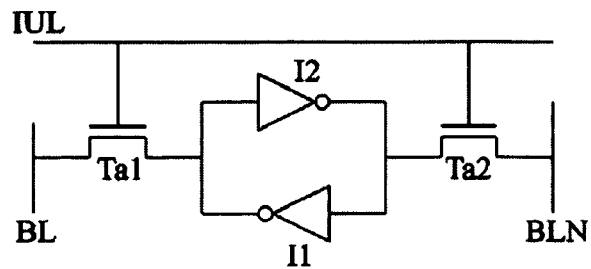
FIG. 1 is a schematic representation, previously described, of a SRAM point.

A conventional physical description of the SRAM point corresponding to the physical and schematic representations of FIGS. 1 and 6 is given in the following table IV:

X1: inverter replica-(6;1)
    X2: inverter replica-vertical symmetry-(4;1)
    X3: transistor replica-(0;1.5)
    X4: transistor replica-(11;1.5)
    p22: (4.75;7.5)(7.25;7.5)(7.25;6.25)(7.75;6.25)(7.75;8)(4.75;8)-métal1
    p23: (6.25;5)(9.25;5)(9.25;5.5)(6.75;5.5)(6.75;6.75)(6.25;6.75)-métal1
    p24: (2.25;1.75)(4.75;1.75)(4.75;2.25)(2.25;2.25)-métal1
    p25: (9.25;1.75)(11.75;1.75)(11.75;2.25)(9.25;2.25)-métal1
    p26: (0;5)(14;5)(14;5.5)(0;5.5)-métal2
    p27: (0.25;0)(0.75;0)(0.75;13)(0.25;13)-métal3
    p28: (13.25;0)(13.75;0)(13.75;13)(13.25;13)-métal3

An annotated physical description of the SRAM point is given in the following table V:

p22: (4.75;7.5)(7.25;7.5)(7.25;6.25)(7.75;6.25)(7.75;8)(4.75;8)-métal1-C2
    p23: (6.25;5)(9.25;5)(9.25;5.5)(6.75;5.5)(6.75;6.75)(6.25;6.75)-métal1-C1
    p24: (2.25;1.75)(4.75;1.75)(4.75;2.25)(2.25;2.25)-métal1-C1
    p25: (9.25;1.75)(11.75;1.75)(11.75;2.25)(9.25;2.25)-métal1-C2
    p26: (0;5)(14;5)(14;5.5)(0;5.5)-métal2-WL
    p27: (0.25;0)(0.75;0)(0.75;13)(0.25;13)-métal3-BLN
    p28: (13.25;0)(13.75;0)(13.75;13)(13.25;13)-métal3-BL
    X1: inverter replica-(6;1)-C2:Z, C1:A, Vdd:Vdd, GND:GND
    X2: inverter replica-vertical symmetry-(4;1)-C1:Z, C2:A, Vdd:Vdd, GND:GND
    X3: transistor replica-(0;1.5)-C2:E2, BLN:E1, WL:G
    X4: transistor replica-(11;1.5)-C1:E1, BLN:E2, WL:G In the line relative to replica X1, C2:Z means that the area associated with connection Z in the inverter prolongs the areas associated with connection C2 in the memory point. Similarly, C1:A means that the area associated with connection A in the inverter prolongs the areas associated with connection C1 in the memory point. Notations Vdd:Vdd and GND:GND mean that the area associated with connection Vdd or GND in the inverter prolong the area associated with connection Vdd or GND in the memory point. The notations used for the other replicas are identical.

Based on the connection information given in each of the annotated physical descriptions, it is possible to find to which connection corresponds each of the metal areas defined on the various hierarchical levels, each area assembly associated with a connection forming a track.

An annotated physical description of a circuit with a hierarchical physical description may be obtained according to various methods substantially identical to those mentioned hereabove in the preceding part.

2. Signal Types and Associated Rules—Verifications

After having created an annotated description of the studied circuit which enables associating with each connection of the schematic representation of the circuit a track of the physical representation of the circuit, the following steps of the method of the present invention aims at verifying that each track is adapted to its use.

Each track is used to propagate one or several types of electric signals which can be determined by the circuit designer. Each type of signal may be described by a time representation of the electric potential of a connection and/or of the current flowing through a connection. The most current signal types are the following:
- a signal of "steady" type for which the voltage is substantially constant along time.
- a signal of "clock" type, for which the voltage periodically varies from low level "0" to high level "1", each level switching being performed rapidly, that is, with a steep edge.
- a signal of "HF" type, for which the voltage varies rapidly along time.
- a signal of "random" type, for which the voltage changes according to the circuit activity.
- a signal of "current peak" type, for which at given times, the current reaches a very high value.
- a signal of "strong current" type, for which a substantially high current is observed for a relatively long time.

The above-described signal types are given as an indication. Many other signal types may be devised by those skilled in the art.

Further, a given track may be used to propagate signals of various types. A track conducting the supply voltage propagates a signal of "steady" type, but may also propagate a signal of "current peak" or "strong current" type especially according to the circuit activity.

Further, the types of signals capable of propagating on the various circuit connections may be determined on functional verification of the circuit performed by means of an electric simulation.

The types of signals finally studied will in fact be defined according to the problems that the circuit designer wishes to detect. For electromigration problems, signals of "current peak" or "strong current" type will especially be considered. For voltage drop problems, signals of "steady" type will rather be considered, especially to verify the circuit supply network. For stray capacitive coupling problems, signals of "clock" or "HF" type will be considered.

Once the signal type(s) which are desired to be studied have been determined, it is set for each signal type what rules must be verified by the circuit tracks corresponding to the connections on which the considered signal type is capable of propagating. Examples of rules are given hereafter in the case where electromigration, voltage drop, or stray capacitive couplings problems are desired to be detected.

In the case of the electromigration problem, it is desired to determine whether the tracks corresponding to connections on which signals of "current peak" or "strong current" type are capable of propagating are sufficiently "wide". In other words, it is desired to determine whether at any point of the considered track, the current density is not too high.

Figure 8:
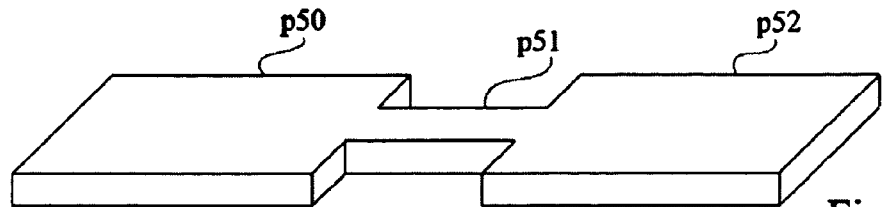
FIG. 8 is a perspective view of a track.

FIG. 8 is a perspective view of a track formed of three successive metal areas p50, p51, and p52 placed on a same metallization level. The areas all have the same thickness, as current in integrated circuits. Areas p50 and p52 are relatively wide and area p51 connecting the two other areas is relatively narrow.

Figure 9:
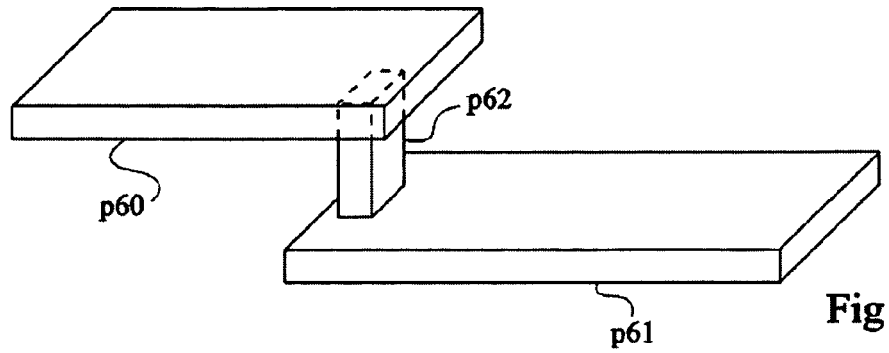
FIG. 9 is a perspective view of a track.

FIG. 9 is a perspective view of another track formed of two relatively wide metal tracks p60 and p61 placed on two adjacent metal levels, area p61 being placed on the lower level. A relatively thin conductive via p62 connects an end of area p60 to an end of area p61.

In the two above-mentioned examples, there clearly appears that narrow area p51 and conductive via p62 are the track elements through which the current density risks to be high. A track end much narrower than the rest often is a design error which can be relatively often encountered in a hierarchical circuit when it is not always easy to visualize all the track areas belonging to different hierarchical levels. The presence of a single relatively narrow conductive via between metal areas placed on adjacent levels also is a relatively current design error.

A possible rule of verification of the tracks corresponding to connections on which signals of "current peak" or "strong current" type are capable of propagating is the following. The ratio of the cross-section areas of two consecutive areas of a track must not be greater than or smaller than predetermined threshold values. The threshold values are set according to technological parameters such as the type of material and its resistance.

In the case of the voltage drop problem, it is desired to determine whether the tracks corresponding to connection on which signals of "steady" type are capable of propagating are not too resistive.

Figure 10:
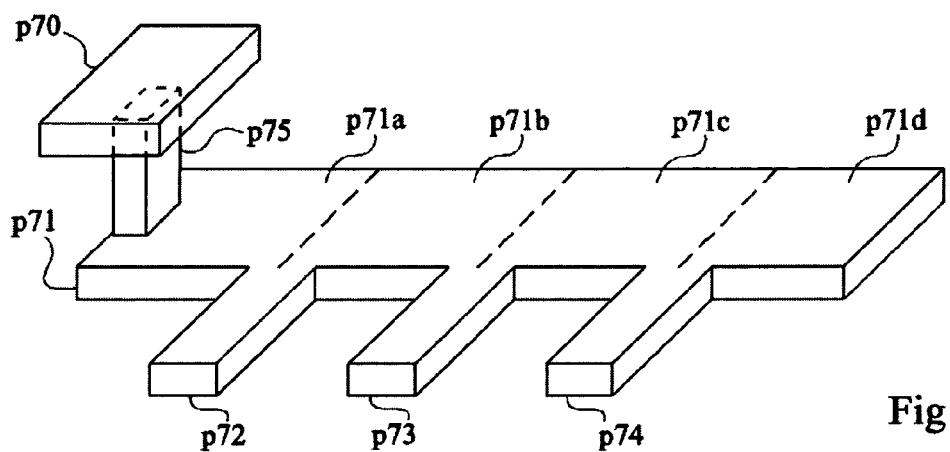
FIG. 10 is a perspective view of a track.

FIG. 10 is a perspective view of a track intended to propagate the circuit supply voltage. The track comprises a metal area p70 for example placed on a second metallization level and four metallization areas p71, p72, p73, and p74 placed on a first metallization level. Area p71 substantially has the shape of a rail. An end of area p70 is connected to an end of area p71 by a conductive via p75. Areas p72, p73, and p74, of same lengths, are placed at regular intervals against area p71 perpendicularly thereto, track p72 being the closest to conductive via p75. The end of area p70 unconnected to via p75 is connected to a supply terminal. The supply voltage then propagates through the conductive via to the end of areas p71 to p74.

Figure 11:
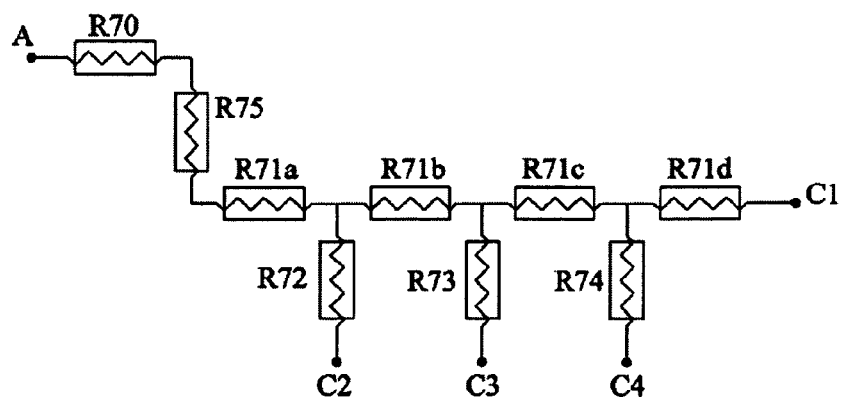
FIG. 11 is an equivalent electric diagram of the track shown in FIG. 10.

FIG. 11 is an equivalent electric diagram of the track shown in FIG. 10. Each area or area portion can be modeled by a resistor. Area p70 has an equivalent resistance R70, the conductive via has an equivalent resistance R75. Rail-shaped area p71 is cut into four areas p71a, p71b, p71c, and p71d starting from the conductive via, the limits between these areas being placed in prolongation of areas p72, p73, and p74. Areas p71a, p71b, p71c, and p71d respectively have equivalent resistances R71a, R71b, R71c, and R71d. Areas p72, p73, and p74 have equivalent resistances R72, R73, and R74. On the equivalent electric diagram of the track, resistors R70, R75, R71a, R71b, R71c, and R71d are placed in series between a terminal A through which the circuit is supplied and a terminal C1 connected to a circuit component not shown. Resistors R72, R73, and R74 each have a terminal respectively connected between R71a/R71b, R71b/R71c, and R71c/R71d. The free terminals of resistors R72, R73, and R74 are respectively called C2, C3, and C4 and are connected to components not shown. Areas p72, p73, and p74 being of same lengths, resistors R72, R73, and R74 are identical.

Considering that each of the components connected to terminals C1 to C4 is likely to conduct an identical current, and knowing that the voltage drop across a resistor is proportional to its resistance and to the current flowing therethrough, there clearly appears that a maximum supply voltage drop can be detected at the level of terminals C1 and C4.

A possible rule for verifying the tracks corresponding to connections on which signals of "steady" type are capable of propagating is the following. The equivalent resistance between a "starting point" and an "end point" of the track, along which the signal propagates, must be smaller than a predetermined value.

In the case of the problem of stray capacitive couplings, it is desired to determine whether the tracks capable of propagating signals of "clock" or "HF" type are not too close to other tracks of the circuit, which could induce a state switching of these other tracks, or an advance or a delay of the signal propagating on these other tracks.

Figure 12:
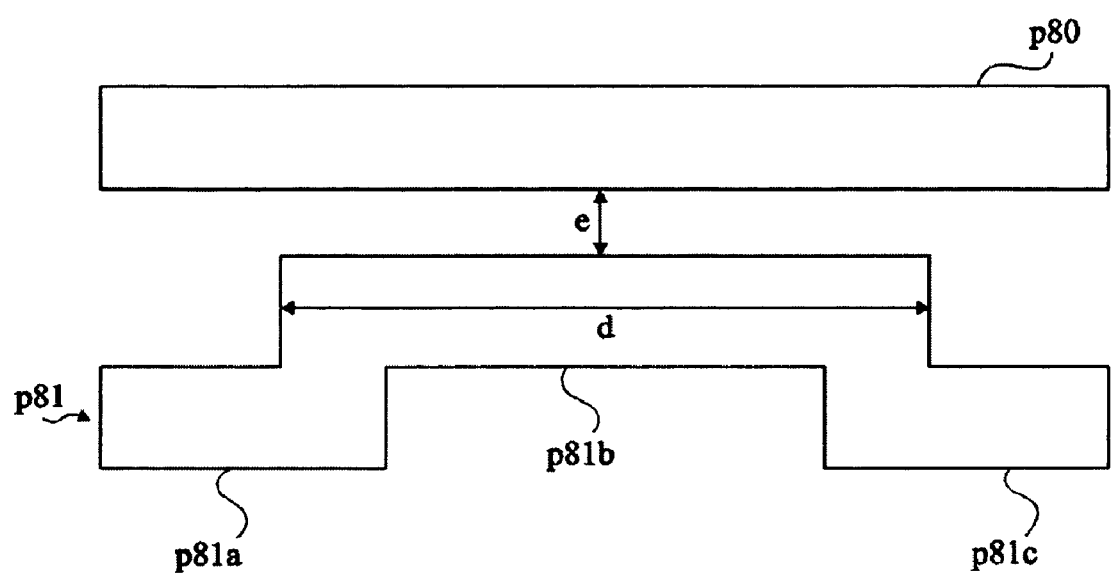
FIG. 12 is a top view of two tracks.

FIG. 12 is a top view of two tracks p80 and p81 placed on a same metallization level. Track p80 is rectilinear and appears to be horizontal in FIG. 12. Track p81 is placed close to track p80 substantially parallel to the latter. Track p81 is substantially formed of three successive rectilinear portions p81a, p81b, and p81c appearing as being horizontal. The two portions p81a and p81c are placed at each end on the same axis. Portion p81b, in contact with the other portions p81a and p81c, is shifted to the side of track p80.

The stray capacitance between the two tracks being inversely proportional to the spacing between tracks, the proximity of track p80 and of track portion p81b strongly contributes to creating a non-negligible stray capacitance between tracks p80 and p81. Further, the stray capacitance between two tracks is proportional to their opposite surface areas. In this example, the stray capacitance between tracks p80 and p81 is substantially proportional to length d of track portion p81b.

A possible rule for verifying the tracks corresponding to connections on which signals of "HF" or "clock" type are capable of propagating is the following. It is first searched whether a circuit track is "close" to the studied track, that is, if the spacing between the studied track and another circuit track is smaller than a predetermined distance. Finally, in the case where all or part of a track is close to the studied track, the opposite surface area between these two tracks is evaluated to determine the stray capacitance between these tracks. The calculated stray capacitance must then be smaller than a predetermined value.

In parallel or after the laying down of the rules to be verified by each of the types of signals which are desired to be studied, which are the signal type(s) capable of propagating on the circuit connections which are desired to be verified is determined. It is then verified whether each track corresponding to a connection which is desired to be studied verifies the rules corresponding to the signal types capable of propagating on the considered connection.

At the end of this verification, the physical representation of the circuit may be displayed and the tracks likely to exhibit a technical defect may be highlighted. An advantage of the present invention is that, due to the annotated physical description, it is possible to rapidly and easily identify the set of polygons of a defective track. Thus, in the case where the physical representation of the circuit comprises a large number of hierarchical level, it is possible to highlight the set of polygons of a track placed on different hierarchical levels.

Further, the verification method according to the present invention may be implemented on a small circuit portion without it being necessary to extract the circuit parasitic components. Further, it is not necessary to perform an electric simulation of the entire circuit, requiring large computer resources. Once the annotated physical representation has been formed, the various circuit portions may advantageously be verified in parallel. This enables performing an analysis within a very short time.

Of course, the present invention is likely to have various, alterations, improvements, and modifications which will readily occur to those skilled in the art. In particular, it may be attempted to detect problems different from those mentioned hereabove. Further, different rules of verification of the tracks corresponding to connections on which signals of a given type are capable of propagating may be provided. Further, those skilled in the art may define other types of signals capable of propagating over a circuit connection.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for verifying connections of an integrated circuit comprising components connected by said connections, the integrated circuit being defined by a "physical" representation and a "schematic" representation, the physical representation consisting of an assembly of polygons of various types used to form a set of masks for manufacturing the integrated circuit, the schematic representation symbolically defining the circuit components and the connections between these components, the method comprising the steps of:

establishing an annotated physical description of the circuit which enables associating with each of said connections of the schematic representation a set of polygons from the assembly of polygons of the physical representation that corresponds to a considered connection, each set of polygons associated with each of said connections forming a track; and analyzing the tracks corresponding to said connections to be verified, by:

defining at least one type of electric signal capable of propagating on said connections;

defining, for each signal type, one or several rules to be verified by each of the tracks corresponding to the connections on which said electric signal is capable of propagating, specific geometric features of a given track or features relative to the positioning of a given track with respect to other tracks having to be verified for each rule; and determining, for each of said connections to be verified, whether the tracks associated with said connections verify the one or several rules corresponding to the signal types capable of propagating on each of said connections;

wherein at least one signal type refers to at least one of an intensity value and a time variation of an intensity of a current running through a given connection, and wherein a rule to be verified by each of the tracks corresponding to the connection consists of verifying that a ratio of cross-sectional areas of integrated circuit areas corresponding to two consecutive polygons of a track ranges between two predetermined values.

2. A method for verifying the connections of an integrated circuit comprising components connected by said connections, the integrated circuit being defined by a "physical" representation and a "schematic" representation, the physical representation consisting of an assembly of polygons of various types used to form a set of masks to be used for manufacturing the integrated circuit, the schematic representation symbolically defining the circuit components and the connections between these components, the method comprising the steps of:

establishing an annotated physical description of the circuit which enables associating with each of said connections of the schematic representation a set of polygons from the assembly of polygons of the physical representation that corresponds to a considered connection, each set of polygons associated with each of said connections forming a track; and analyzing the tracks corresponding to said connections to be verified, by:

defining at least one type of electric signal capable of propagating on said connections;

defining, for each signal type, one or several rules to be verified by each of the tracks corresponding to the connections on which said electric signal is capable of propagating, specific geometric features of a given track or features relative to the positioning of a given track with respect to other tracks having to be verified for each rule; and determining, for each of the connections to be verified, whether the tracks associated with these connections verify the one or several rules corresponding to the signal types capable of propagating on each of said connections; wherein at least one signal type refers to a voltage substantially steady along time on a given connection, and wherein a rule to be verified by each of the tracks corresponding to said connections consists of verifying that an equivalent resistance of areas of the integrated circuit corresponding to all or part of a considered track is not greater than a predetermined value.

3. A method for verifying the connections of an integrated circuit comprising components connected by said connections, the integrated circuit being defined by a "physical" representation and a "schematic" representation, the physical representation consisting of an assembly of polygons of various types used to form a set of masks to be used for manufacturing the integrated circuit, the schematic representation symbolically defining the circuit components and the connections between these components, the method comprising the steps of:

establishing an annotated physical description of the circuit which enables associating with each of said connections of the schematic representation a set of polygons from the assembly of polygons of the physical representation that corresponds to a considered connection, each set of polygons associated with each of said connections forming a track; and analyzing the tracks corresponding to said connections to be verified, by:

defining at least one type of electric signal capable of propagating on said connections;

defining, for each signal type, one or several rules to be verified by each of the tracks corresponding to the connections on which said electric signal is capable of propagating, specific geometric features of a given track or features relative to the positioning of a given track with respect to other tracks having to be verified for each rule; and determining, for each of said connections to be verified, whether the tracks associated with these connections verify the one or several rules corresponding to the signal types capable of propagating on each of the connections; wherein at least one signal type refers to a fast time variation of an electrical potential of a given connection, and wherein a rule to be verified by each of the tracks corresponding to the connections consists of verifying whether a portion of said considered track is located close to another track with a distance smaller than a predetermined value, and if such is the case, verifying whether a stray capacitance between the considered track and other tracks is greater than a predefined maximum value.

* * * * *